United States Patent
Shiobara

(10) Patent No.: US 8,115,526 B2
(45) Date of Patent: Feb. 14, 2012

(54) PLL OSCILLATOR CIRCUIT

(75) Inventor: Tsuyoshi Shiobara, Chitose (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/929,380

(22) Filed: Jan. 20, 2011

(65) Prior Publication Data

US 2011/0181327 A1    Jul. 28, 2011

(30) Foreign Application Priority Data

Jan. 28, 2010   (JP) ................................ P.2010-017075

(51) Int. Cl.
    *H03L 7/06* (2006.01)
(52) U.S. Cl. ........................................ 327/156; 327/147
(58) Field of Classification Search .................. 327/147, 327/156
    See application file for complete search history.

(56) References Cited

U.S. PATENT DOCUMENTS

| | | | | |
|---|---|---|---|---|
| 4,280,140 A | * | 7/1981 | Skerlos | 348/735 |
| 4,302,778 A | * | 11/1981 | Tanaka | 348/735 |
| 7,079,555 B2 | * | 7/2006 | Baydar et al. | 370/532 |
| 7,706,111 B2 | * | 4/2010 | Shimazaki et al. | 361/29 |
| 7,773,352 B2 | * | 8/2010 | Mishima | 361/30 |
| 2006/0085671 A1 | * | 4/2006 | Majni et al. | 714/5 |
| 2006/0208675 A1 | * | 9/2006 | Alberkrack et al. | 318/254 |
| 2008/0239594 A1 | * | 10/2008 | Shimazaki et al. | 361/23 |
| 2011/0110002 A1 | * | 5/2011 | Ooshima | 361/33 |

FOREIGN PATENT DOCUMENTS

| | | |
|---|---|---|
| JP | 05-072244 | 3/1993 |
| JP | 09-023154 | 1/1997 |
| JP | 10-173520 | 6/1998 |
| JP | 2001-183423 | 7/2001 |
| WO | 02/33433 | 4/2002 |

* cited by examiner

*Primary Examiner* — Lincoln Donovan
*Assistant Examiner* — Adam Houston
(74) *Attorney, Agent, or Firm* — Jacobson Holman PLLC

(57) ABSTRACT

Disclosed is a PLL oscillator circuit capable of examining an unlock state while being equipped with an auto retry function enabling automatic relock. In the PLL oscillator circuit, a MPU receives a lock detection signal from the PLL-IC that receives an external reference signal and an output signal from a VCXO and outputs a control voltage to the VCXO, sets data for unlock alarm test at the PLL-IC, the data turning a lock state into an unlock state, when determining an unlock state with the lock detection signal from the PLL-IC, outputs an unlock alarm output signal to the outside, determines whether the unlock state continues for a first time period, and when the unlock state continues for the first time period, executes retry to set data for relock at the PLL-IC.

19 Claims, 5 Drawing Sheets

PLL OSCILLATOR CIRCUIT

This application has a priority of Japanese no. 2010-017075 filed Jan. 28, 2010, hereby incorporated by reference.

BACKGROUND OF THE INVENTION

1. Field of the Invention

The present invention relates to a phase locked loop (PLL) oscillator circuit, and more particularly relates to a PLL oscillator circuit that detects an unlock state, while automatically retrying relock.

2. Description of the Related Art

[Prior Art]

A PLL oscillator circuit feed-back controls an oscillator in a loop for oscillation so as to keep a constant phase difference between the output from the oscillator and an externally input reference signal.

The PLL oscillator circuit can output a stable oscillatory frequency and is applied to electronic equipment and communication equipment.

[Conventional PLL Oscillator Circuit: FIG. 5]

The following describes a conventional PLL oscillator circuit, with reference to FIG. 5. FIG. 5 is a block diagram exemplifying the configuration of a typical PLL oscillator circuit.

As illustrated in FIG. 5, the PLL oscillator circuit includes: a phase comparator 32 that compares a 1/N divided signal with reference to an external reference signal (F ref) to output a phase differential signal; a charge pump 33 that outputs the phase difference with a voltage of a corresponding pulse width; a loop filter 34 that smoothes the output voltage from the charge pump 33; a voltage controlled crystal oscillator (VCXO) 35 that oscillates and outputs a desired frequency (internal reference signal: output frequency) by regulating the frequency in accordance with the control voltage from the loop filter 34; and a divider 36 that divides the output (internal reference signal) from the VCXO 35 into 1/N.

The output signal has the frequency of N×F ref.

The PLL oscillator circuit operates to feed-back controls the internal VCXO 35 so that a phase difference between the externally input reference signal and the internal VCXO 35 is kept constant, thus obtaining the output of the oscillator locked with the reference signal.

More specifically, the phase comparator 32 compares the phase of the output signal from the VCXO 35 subjected to frequency control by the input voltage with a relatively stable external reference signal and feeds back a DC voltage obtained by smoothing the phase comparison result to the VCXO 35 for PLL control, so as to generate a signal with high precision.

[Related Art]

Related art includes: Japanese Patent Application Laid-Open No. H05-072244 "Phase locked loop (PLL) performance tester" (Applicant: Matsushita Electric Ind Co Ltd/Patent Document 1), Japanese Patent Application Laid-Open No. H09-023154 "PLL circuit" (Applicant: Fujitsu General Ltd/Patent Document 2), Japanese Patent Application Laid-Open No. H10-173520 "PLL circuit" (Applicant: Kawasaki Steel Co/Patent Document 3), Japanese Patent Application Laid-Open No. 2001-183423 "Semiconductor integrated circuit" (Applicant: NEC IC Microcomputer System, Ltd/Patent Document 4), and Japanese Translation of PCT International Application Publication No. 2004-511993 (WO 02/33433) "Built-in self-test circuitry for testing a phase locked loop circuit" (Applicant: Koninklijke Philips Electronics N.V./Patent Document 5).

Patent Document 1 discloses a PLL performance tester that generates a test signal to measure a pull-in range and a lock range while changing the frequency thereof and determines a lock state from the generated test signal and a feedback signal from a PLL so as to detect the frequency of the test signal at the time of change between a lock state and an unlock state.

Patent Document 2 discloses a PLL circuit that compares a plurality of VCO control voltages for locking, determines the control direction of a factor of a factor multiplier to output a direction determination signal, and switches between up and down of the factor in accordance with an unlock detection signal and the direction determination signal to decide a factor.

Patent Document 3 discloses a PLL circuit that controls a reset signal to discharge at least one of an error signal and a control signal.

Patent Document 4 discloses a semiconductor integrated circuit that outputs an enable signal to a BIST circuit storing test result data so as to start a test based on a real operating speed corresponding to a phase lock time of an PLL circuit provided therewith.

Patent Document 5 discloses a self-test circuitry, in which a ratio of a multiplier for each frequency multiplier to a divider of its corresponding divide-by-counter in a frequency divider is a constant value for all frequency multipliers and corresponding divide-by-counters, and when a frequency multiplier among the plurality of frequency multipliers is selected, a multiplexer selects its corresponding divide-by-counter to produce a test output clock.

Patent Document 1: Japanese Patent Application Laid-Open No. H05-072244
Patent Document 2: Japanese Patent Application Laid-Open No. H09-023154
Patent Document 3: Japanese Patent Application Laid-Open No. H10-173520
Patent Document 4: Japanese Patent Application Laid-Open No. 2001-183423
Patent Document 5: Japanese Translation of PCT International Application Publication No. 2004-511993

SUMMARY OF THE INVENTION

A conventional PLL oscillator circuit needs to be examined in a production line for the circuit as to whether an unlock alarm signal can be correctly output to the outside when its phase comparator is in an unlock state.

To this end, a signal for unlock alarm test is input to the phase comparator to turn the phase comparator into the unlock state, so as to monitor whether or not an unlock alarm signal can be output to the outside.

In the conventional PLL oscillator circuit, however, when the phase comparator turns in the unlock state by a signal for unlock alarm test, a normal PLL operation can be recovered by restarting or by externally inputting a normal signal, which takes time and trouble for relock although.

In view of the above-stated problems, it is an object of the present invention to provide a PLL oscillator circuit capable of examining an unlock state while being equipped with an auto retry function enabling automatic relock.

In order to cope with the above-stated problems in the conventional examples, a PLL oscillator circuit of the present invention includes: a voltage controlled oscillator that generates a frequency signal for oscillation in accordance with an input control voltage; a PLL-IC that receives an external reference signal and an oscillatory output signal from the voltage controlled oscillator as input, compares phase between the external reference signal and the oscillatory output signal to detect a phase difference therebetween, and outputs a phase differential signal corresponding to the phase difference, while outputting a lock detection signal indicating a lock state where the signals are locked or an unlock state where the signals are not locked; a loop filter that cancels noise of a high-frequency component in the phase differential signal from the PLL-IC; and a processor that receives a lock detection signal from the PLL-IC, sets data for unlock alarm test at the PLL-IC, the data turning a lock state into an unlock state, when determining an unlock state with the lock detection signal from the PLL-IC, outputs an unlock alarm output signal to the outside, determines whether or not the unlock state continues for a first time period, and when the unlock state continues for the first time period, executes retry to set data for relock at the PLL-IC. Thereby, the PLL oscillator circuit of the present invention has the advantage of facilitating retrying for relock, while examining an unlock state.

A PLL oscillator circuit of the present invention includes: a voltage controlled oscillator that generates a frequency signal for oscillation in accordance with an input control voltage; a divider that divides the frequency signal; an AD converter that analog-to-digital (AD) converts the divided signal; a phase comparator that compares a phase of the AD-converted signal with a phase of a sinusoidal signal to detect a phase difference therebetween, and outputs a phase differential signal corresponding to the phase difference; a loop filter that cancels noise of a high-frequency component in the phase differential signal; a DA converter that digital-to-analog converts the phase differential signal with noise cancelled; a parameter output part that outputs a frequency parameter to other parts; and a processor that determines an unlock state and outputs an unlock alarm output signal. The phase comparator includes, as an automatic gain control circuit, a multiplier provided at a subsequent stage of the AD converter and an amplitude information detector that detects amplitude information for controlling a gain of the multiplier and outputs an unlock detection signal based on the amplitude information. The processor determines a lock state or an unlock state based on the unlock detection signal, sets a command for unlock alarm test at the parameter output part, the command turning a lock state into an unlock state, when determining an unlock state with the unlock detection signal, outputs an unlock alarm output signal to the outside, determines whether or not the unlock state continues for a first time period, and when the unlock state continues for the first time period, executes retry to set data for relock at the parameter output part. Thereby, the PLL oscillator circuit of the present invention has the advantage of facilitating retrying for relock, while examining an unlock state.

In the above-stated PLL oscillator circuit of the present invention, the phase comparator includes: a carrier remove that quadrature-detects an output from the AD converter to acquire a rotational vector that rotates with a frequency difference between an output signal from the AD converter and a signal for detection; an inverse-rotational vector multiplier that multiplies the rotational vector by an inverse-rotational vector; a phase time difference detector that detects a phase difference for every sampling time based on the rotational vector reduced in speed by multiplication; an adder that subtracts a fine adjustment frequency from the detected phase difference; and a phase difference accumulator that accumulates an output from the adder for a given time period. The amplitude information detector monitors amplitude information detected from a signal that is branched off and input from an output from the inverse-rotational vector multiplier and outputs an unlock detection signal when the amplitude information falls within a specific range.

In the above-stated PLL oscillator circuit of the present invention, when an unlock state does not continue for the first time period, the processor determines whether or not a lock state continues for a second time period, and when a lock state continues for the second time period, the processor turns the unlock alarm output signal into an alarm cancellation state and does not execute retry.

In the above-stated PLL oscillator circuit of the present invention, when an unlock state does not continue for the first time period, the processor determines whether or not a lock state continues for a second time period, and when a lock state does not continue for the second time period, the processor does not execute retry until an unlock state continues for the first time period.

In the above-stated PLL oscillator circuit of the present invention, the first time period is set longer than the second time period.

In the above-stated PLL oscillator circuit of the present invention, the first time period is set shorter than the second time period.

In the above-stated PLL oscillator circuit of the present invention, the processor manages the number of retries, and when retry is executed a specific number of times, the processor stops retry and holds an unlock alarm output signal.

DESCRIPTION OF REFERENCE NUMERALS

Figure 1:
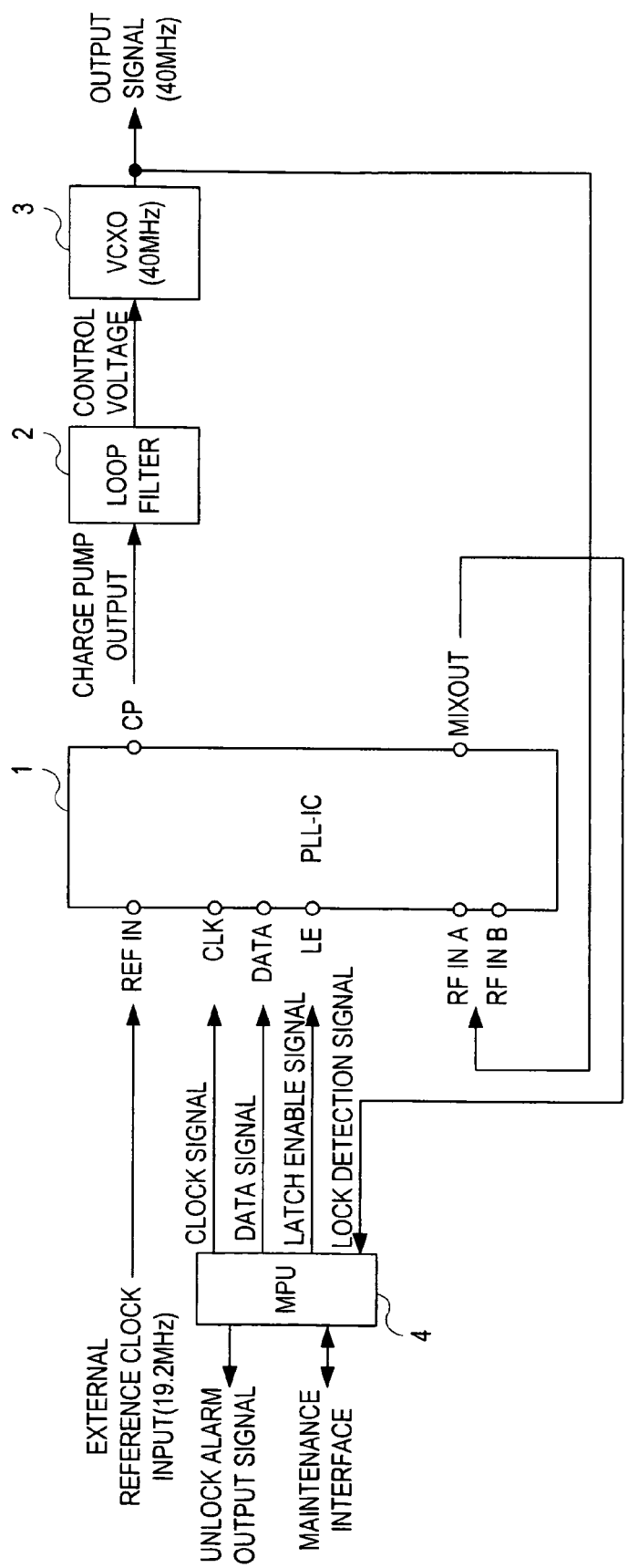
FIG. 1 is a block diagram illustrating the configuration of a first PLL oscillator circuit according to one embodiment of the present invention.

1 PLL-IC
2 Loop filter
3 Voltage controlled crystal oscillator (VCXO)
4 Processor (MPU)
11 VCO
12 Divider (NN)
13 Low pass filter (LPF)
14 AD converter (A/D)
15 Reference clock generator
16 Carrier remove
17 Inverse-rotational vector multiplier
18 Phase time difference detector
19 Adder
20 Phase difference accumulator
21 Loop Filter
22 DA converter (D/A)
23 Voltage output part
24 Adder
25 Parameter output part
26 Amplitude information detector
27 Filter
28 Multiplier
30 Maintenance interface part
32 Phase comparator
33 Charge pump
34 Loop filter 35 Voltage controlled crystal oscillator (VCXO)
36 Divider
101 Amplifier
102 24-bit input register
103 Differential amplifier
104 14-bit R counter
105 R counter latch
106 Function latch
107 N counter latch
108 13-bit N counter
109 Amplifier
110 Amplifier
111 Phase frequency detector
112 Charge pump
113 Reference output circuit (Reference)
114 Lock detector
115 First current setting circuit (Current setting 1)
116 Second current setting circuit (Current setting 2)
117 Multiplexer (MUX)
118 Amplifier

DESCRIPTION OF PREFERRED EMBODIMENT

The following describes embodiments of the present invention, with reference to the drawings.

Summary of Embodiments

A PLL oscillator circuit according to embodiments of the present invention includes: a voltage controlled oscillator; a PLL-IC that receives an external reference signal and an oscillatory output signal from the voltage controlled oscillator as input, compares phase between these signals to detect a phase difference, and outputs a phase differential signal corresponding to the phase difference, while outputting a lock detection signal indicating a lock state where these signals are locked or an unlock state where these signals are not locked; a loop filter that cancels noise of a high-frequency component in the output from the PLL-IC; and a processor that receives a lock detection signal from the PLL-IC, sets data for unlock alarm test at the PLL-IC, the data turning a lock state into an unlock state, when determining an unlock state with the lock detection signal from the PLL-IC, outputs an unlock alarm output signal to the outside, determines whether or not the unlock state continues for a first time period, and when the unlock state continues for the first time period, executes retry to set data for relock at the PLL-IC. Thereby, the PLL oscillator circuit can retry for relock easily, while examining an unlock state.

[First PLL Oscillator Circuit: FIG. 1]

The following describes a first PLL oscillator circuit according to one embodiment of the present invention, with reference to FIG. 1. FIG. 1 is a block diagram illustrating the configuration of a first PLL oscillator circuit according to one embodiment of the present invention.

As illustrated in FIG. 1, the first PLL oscillator circuit according to one embodiment of the present invention (first PLL oscillator circuit) basically includes: a PLL-Integrated Circuit (IC) 1; a loop filter 2; a voltage controlled crystal oscillator (VCXO) 3; and a processor (Micro Processing unit (MPU)) 4.

[Parts of the First PLL Oscillator Circuit]

Various parts of the first PLL oscillator circuit are described below more specifically.

[PLL-IC 1]

The PLL-IC 1 receives an external reference clock at a terminal REF IN as well as an oscillatory output signal from the VCXO 3 at terminals RF IN A and RF IN B, compares phase between these signals, and outputs a voltage of a pulse width corresponding to the phase difference as a charge pump output to the loop filter 2.

The PLL-IC 1 further detects based on the phase comparison whether the circuit is in a lock state where the output signal from the VCXO 3 is locked with the external reference clock or in an unlock state where the output signal from the VCXO 3 is not locked with the external reference clock. If the circuit is in the lock state, the PLL-IC 1 outputs a lock detection signal through a terminal MIXOUT to the MPU 4.

The specific configuration of the PLL-IC 1 is described later.

[Loop Filter 2]

The loop filter 2 cancels noise of a high-frequency component in the output voltage (output signal) from the PLL-IC 1 for smoothing and outputs a control voltage to the VCXO 3.

[VCXO 3]

The VCXO 3 changes the frequency in accordance with the control voltage from the loop filter 2 to output a desired frequency for oscillation, while outputting a part of the output signal to the PLL-IC 1.

[MPU 4]

The MPU 4 receives a lock detection signal indicating the lock state or the unlock state from the output terminal MIXOUT of the PLL-IC 1, and in the case of the unlock state, the MPU 4 outputs an unlock alarm output signal to the outside.

The MPU 4 further outputs, in accordance with configuration data input from a maintenance interface, a clock signal to a terminal CLK of the PLL-IC 1, a data signal to a terminal DATA of the PLL-IC 1, and a latch enable signal to a terminal LE of the PLL-IC 1.

In order to verify that an unlock alarm output signal can be output correctly to the outside when the circuit is shifted from the lock state to the unlock state, the MPU 4 sets data for unlock alarm test at the PLL-IC 1 in the lock state.

Then, upon receipt of the data for unlock alarm test, the PLL-IC 1 turns in the unlock state, and outputs a lock detection signal indicating the unlock state from the output terminal MIXOUT.

Upon receipt of the lock detection signal from the PLL-IC 1, if the unlock state continues for a specific time period (a first time period), the MPU 4 sets data for relock at the PLL-IC 1 and executes retry.

If the unlock state does not continue for the specific time duration (the first time period), the MPU 4 determines whether or not a lock state continues for a specific time period (a second time period). If the lock state continues for such a time period, the MPU 4 outputs an unlock alarm output signal as an alarm cancellation state. If the lock state does not continue, the MPU 4 does not execute retry until the unlock state continues for the above-stated first time period.

The MPU 4 manages the number of retries, and when the circuit still remains in the unlock state in spite of retries a specific number of times, the MPU 4 may stop retry and hold the unlock alarm output signal.

The specific processing by the MPU 4 is described later.

[Summary of Operation of First PLL Oscillator Circuit]

The following is a brief description of the operation of the first PLL oscillator circuit.

The first PLL oscillator circuit of FIG. 1 makes the internal VCXO 3 at 40 MHz locked with the external reference clock at 19.2 MHz.

The PLL-IC 1 sets an appropriate division ratio between the external reference clock and the output of the VCXO 3 to achieve a lock operation.

The division ratio may be set using three serial-bus signals of the clock signal, the data signal and the latch enable signal at the PLL-IC 1 by software control with the MPU 4.

The lock state of the PLL-IC 1 is monitored by the MPU 4 with a lock detection signal, which is then subjected to control for the output polarity of the unlock alarm signal to the outside and the timing and is output as an unlock alarm output signal from the MPU 4.

In accordance with a state configured in the internal registers with the three serial-bus signals of the clock signal, the data signal, and the latch enable signal by the MPU 4, the PLL-IC 1 divides the frequencies of the external reference clock signal and the output signal and compares phase therebetween, and drives the VCXO 3 at the voltage control terminal with the charge pump output corresponding to the phase difference through the loop filter circuit 2.

[PLL-IC 1: FIG. 2]

Figure 2:
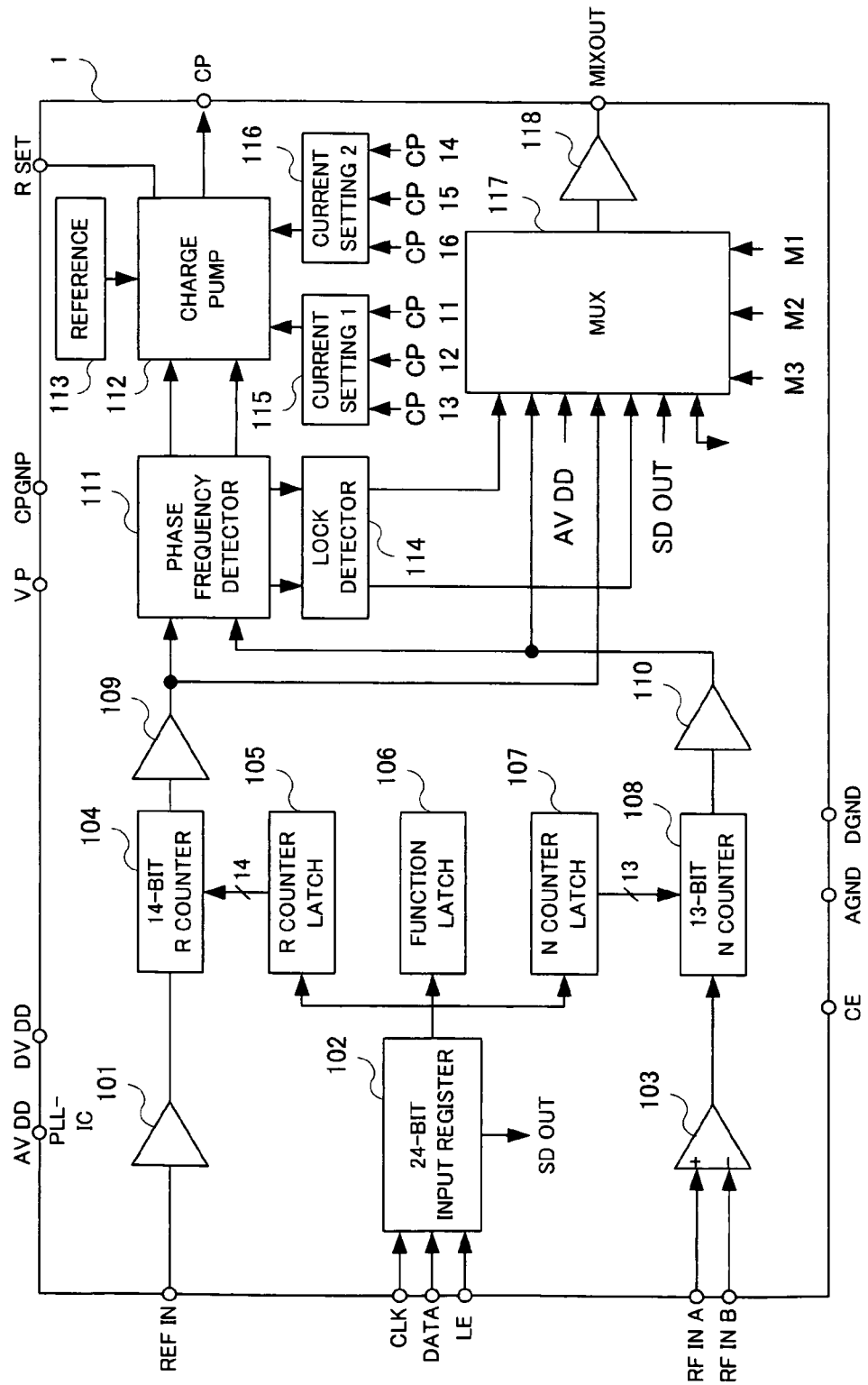
FIG. 2 is a block diagram illustrating the specific circuit configuration of the PLL-IC.

Referring to FIG. 2, the PLL-IC 1 in the first PLL oscillator circuit is described specifically. FIG. 2 is a block diagram illustrating the specific circuit configuration of the PLL-IC. The PLL-IC in FIG. 2 represents a 200 MHz clock generator PLL "ADF4001" manufactured by Analog Devices, Inc.

The ADF 4001 clock generator is used to constitute a PLL clock source that requires a stable reference signal with extremely low noise.

As illustrated in FIG. 2, the PLL-IC 1 includes: an amplifier 101; a 24-bit input register 102; a differential amplifier 103; a 14-bit R counter 104; a R counter latch 105; a function latch 106; a N counter latch 107; a 13-bit N counter 108; an amplifier 109; an amplifier 110; a phase frequency detector 111; a charge pump 112; a reference output circuit (reference) 113; a lock detector 114; a first current setting circuit (current setting 1) 115; a second current setting circuit (current setting 2) 116; a multiplexer (MUX) 117; and an amplifier 118.

In the first PLL oscillator circuit, when the external reference clock is at 19.2 MHz and the output signal of the VCXO 3 is at 40 MHz, for example, a phase comparative frequency can be set at 64 kHz, for example, and the registers can be configured as follows:

The 14-bit R (reference) counter 104 may be set at divide-by-300 (19.2 MHz/300=64 kHz) and the 13-bit N counter 108 may be set at divide-by-625 (40 MHz/625=64 kHz).

Then, in order to verify that the lock detection signal is input as a signal indicating the unlock state and that an unlock alarm signal can be correctly output externally when the PLL-IC 1 turns in the unlock state, the MPU 4 sets the following data at the PLL-IC 1 when the maintenance interface inputs a command for unlock alarm test.

The 13-bit N counter 108 is set at divide-by-512 (40 MHz/512=78.125 kHz) and the setting of the 14-bit R counter 104 is kept at divide-by 300.

The maintenance interface may be implemented at an external personal computer, for example, by communication with control equipment using a start-stop synchronization serial interface.

The above setting changes the frequency division value for the output signal of the 13-bit N counter 108 from the normal "divide-by-625" to "divide-by-512", thus changing the output frequency of the 13-bit N counter 108 into 40 MHz/512=78.125 kHz. Since the output frequency of the 14-bit R counter 104 is 64 kHz, the phase comparison result at the phase frequency detector 111 shows an unlock state.

Programming such that a lock detection signal is output in the lock state from the output terminal MIXOUT of the PLL-IC 1 enables determination between lock and unlock states based on the terminal output state.

The above-stated configuration implements an unlock function by monitoring whether or not the unlock alarm signal correctly turns into an alarm state when the maintenance interface inputs a command for unlock alarm test.

Conventionally, however, when a maintenance interface inputs a command for unlock alarm test, an unlock alarm output signal is left output, and a normal PLL operation has to be returned by restarting or by inputting a command to resend normal data from the maintenance interface.

On the other hand, according to the first PLL oscillator circuit, when a lock detection signal is input to the MPU 4 and the MPU 4 detects unlock of the PLL-IC 1, normal PLL configuration data is automatically resent by software control for retrying relock.

The following describes control processing in detail.

Figure 3:
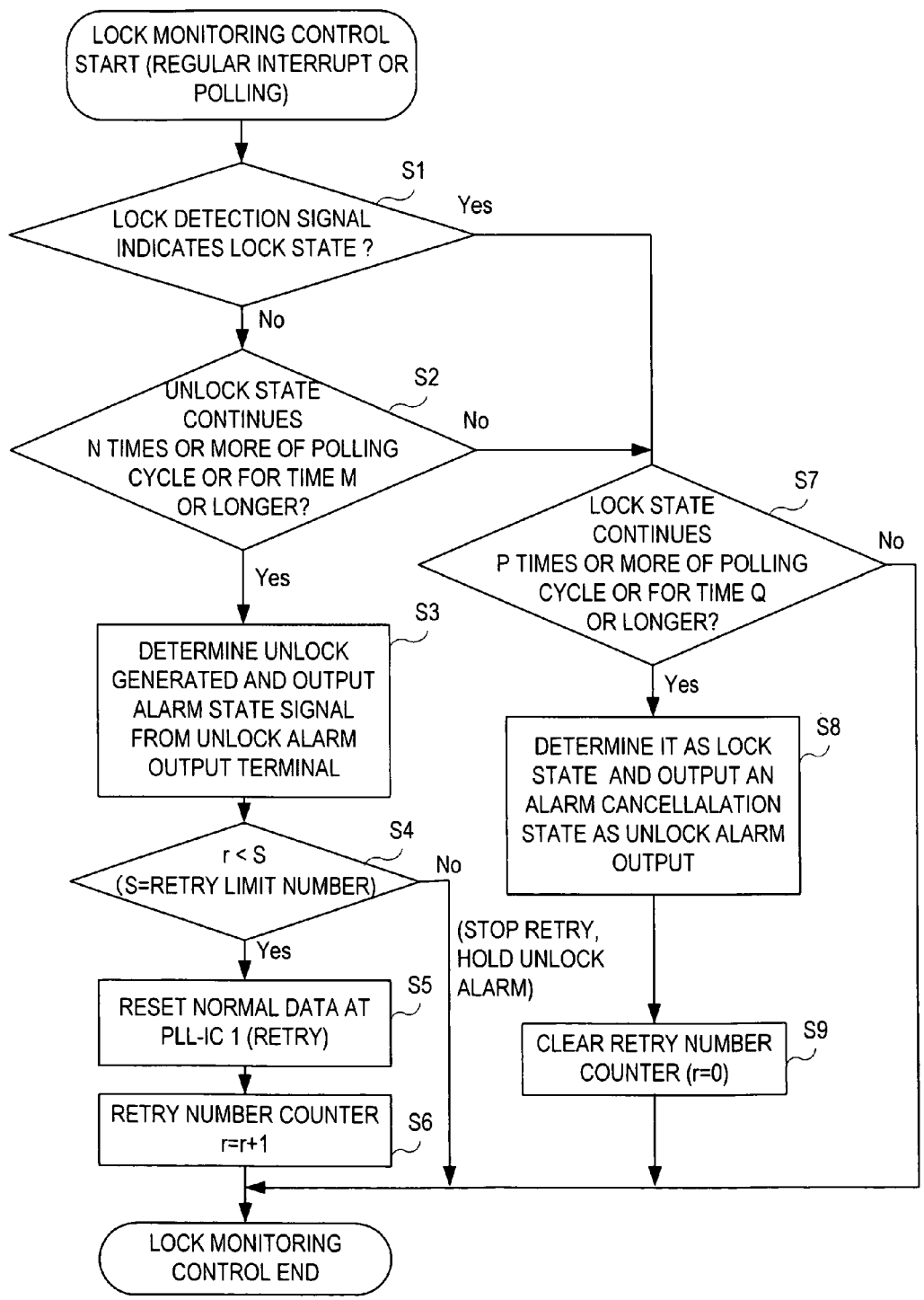
FIG. 3 is a flowchart illustrating the control processing by the first PLL oscillator circuit.

[Control Processing by the First PLL Oscillator Circuit: FIG. 3]

Referring next to FIG. 3, retry controlled lock monitoring control processing in the first PLL oscillator circuit is described below. FIG. 3 is a flowchart illustrating the control processing by the first PLL oscillator circuit. This control processing is performed by the MPU 4.

The MPU 4 starts lock monitoring control as a regular interrupt or polling processing, so as to determine whether a lock detection signal input through the terminal MIXOUT indicates a lock state or not (S1).

If the signal does not indicate a lock state (in the case of No) at the lock state determination processing S1, the MPU 4 then determines whether an unlock state continues N times or more of the polling cycle or for time duration M or longer (S2).

If the unlock state continues (in the case of Yes), the MPU 4 determines that unlock is generated and outputs an alarm signal from the unlock alarm output terminal (S3).

Next, MPU 4 determines whether the number of retries r of a retry counter is smaller or not than a setting value S as a retry limit number (r<S) (S4), and if the retry number r is equal to the setting value S as the retry limit number (in the case of No), the MPU 4 stops retry and holds the unlock alarm to end the processing. Thereby, permanent repeating of retries can be prevented.

In the case of r<S at the determination processing S4 (in the case of Yes), the MPU 4 resets (retries) normal data at the PLL-IC 1 (S5). Subsequently, the MPU 4 increments the retry number counter (r=r+1) (S6), and ends the lock monitoring control processing.

If the lock detection signal indicates a lock state at the determination processing S1 (in the case of Yes), or if the unlock state does not continue N times or more of the polling cycle or for time duration M or longer at the determination processing S2 (in the case of No), the MPU 4 determines whether the lock state continues P times or more of the polling cycle or for time duration Q or longer (S7).

If the lock state does not continue P times or more of the polling cycle or for time duration Q or longer (in the case of No), the MPU 4 ends the lock monitoring control processing.

If the lock state continues P times or more of the polling cycle or for time duration Q or longer (in the case of Yes), the MPU 4 determines it as a lock state and outputs an alarm cancellation state as the unlock alarm output (S8).

Then, the MPU 4 clears the retry number counter (r=0) (S9), and ends the lock monitoring control processing.

Note that the determination processing S2 is provided so as to confirm that the unlock state continues for a certain time period and to exclude an irregular unlock state.

The determination processing S7 is provided so as to confirm that the lock state continues for a certain time period and to exclude an irregular lock state.

The following describes relationships between N, M and P, Q as parameters.

In order to recover from an unlock state quickly and to secure shifting from a lock state to an unlock state, they are set as N<P and M<Q, and conversely in order to make it easy to obtain a lock state but to make it difficult to be in an unlock state, they are set as N>P and M>Q.

Figure 4:
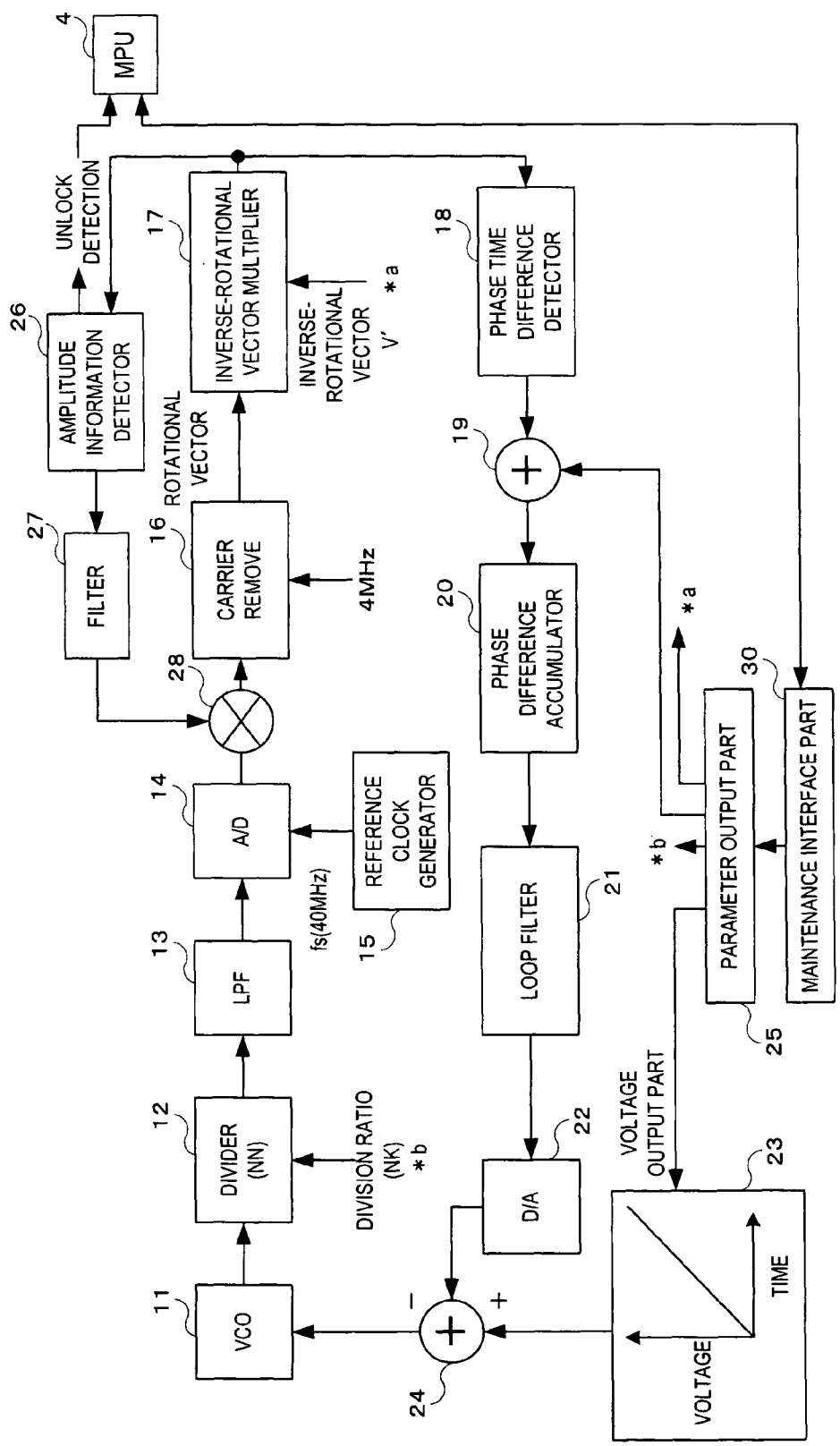
FIG. 4 is a block diagram illustrating the configuration of a second PLL oscillator circuit.
Figure 5:
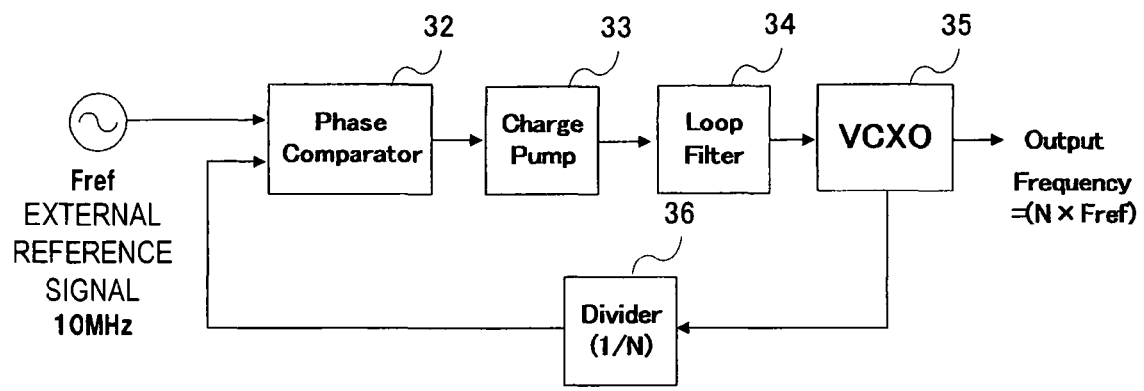
FIG. 5 is a block diagram exemplifying the configuration of a typical PLL oscillator circuit.

[Second PLL Oscillator Circuit: FIG. 4]

Referring now to FIG. 4, a PLL oscillator circuit (a second PLL oscillator circuit) according to another (a second) embodiment is described below. FIG. 4 is a block diagram illustrating the configuration of the second PLL oscillator circuit.

As illustrated in FIG. 4, the second PLL oscillator circuit includes: a VCO 11; a divider (NN) 12; a low pass filter (LPF) 13; an AD converter (A/D) 14; a reference clock generator 15; a DA converter (D/A) 22; a voltage output part 23; and an adder 24 as well as a carrier remove 16, an inverse-rotational vector multiplier 17; a phase time difference detector 18; an adder 19; a phase difference accumulator 20; a loop filter 21; a parameter output part 25; an amplitude information detector 26; a filter 27; a multiplier 28; a maintenance interface part 30 and a MPU 4 that are configured with a field programmable gate array (FPGA).

Herein, the amplitude information detector 26, the filter 27 and the multiplier 28 constitute an automatic gain control circuit (AGC circuit).

[Parts of the Second PLL Oscillator Circuit]

The VCO 11 is a voltage controlled oscillator that receives an input from the adder 24 as a control voltage and oscillates at a predetermined frequency (e.g., 450 MHz to 1,000 MHz).

The divider (NN) 12 divides the output from the VCO 11 to 1/NN based on a frequency division value (NN) externally input and outputs the same to the LPF 13.

The LPF 13 is a filter that lets a lower frequency component of the signal divided by the divider 12 pass therethrough.

The AD converter 14 analog-to-digital converts a signal from the LPF 13 by sampling it with a clock of 40 MHz (fs) from the reference clock generator 15, and outputs the same to the carrier remove 16 of the FPGA.

The DA converter 22 digital-to-analog converts a control signal regulated and controlled by the FPGA. A signal voltage from the DA converter 22 is in the range of 0 to 0.85 V.

The voltage output part 23 outputs a voltage based on a voltage value from the parameter output part 25, and is configured, for example, to increase the output voltage linearly with time to a predetermined voltage.

The adder 24 corrects the voltage output from the voltage output part 23 with the control signal output from the DA converter 22 and outputs the same to the VCO 11 as a control voltage.

The basic function of the FPGA is to compare a rotational vector at a desired output frequency (setting frequency) with a rotational vector of a signal from the AD converter 14 so as to detect a phase difference therebetween, and to generate, based on the phase difference, a control signal that controls the oscillatory frequency of the VCO 11.

The carrier remove 16 quadrature-detects a sinusoidal signal specified by the digital signal from the AD converter 14 using a sinusoidal signal at 4 MHz to acquire a rotational vector V that rotates with the frequency corresponding to a difference between the frequency of the frequency signal specified by the digital signal from the AD converter 14 and the frequency of the sinusoidal signal used for detection.

The inverse-rotational vector multiplier 17 multiplies the rotational vector V by an inverse-rotational vector V' output from the parameter output part 25.

The phase time difference detector 18 detects a phase difference for every sampling time based on the rotational vector V reduced in speed by the inverse-rotational vector multiplier 17. This phase difference corresponds to the frequency of the rotational vector V with reduced speed. When the phase difference becomes zero, the phase time difference detector 18 detects a lock state in PLL, and outputs a lock detection signal to the outside.

The adder 19 subtracts the value of a fine adjustment frequency from the output of the phase time difference detector 18 to bring the frequency closer to a desired oscillatory frequency calculated beforehand, and outputs a phase difference.

The phase difference accumulator 20 accumulates the output from the adder 19 for given time duration, and outputs the same. The phase difference accumulator 20 includes a filter to set the dumping at an optimal value.

The carrier remove 16, the inverse-rotational vector multiplier 17, the phase time difference detector 18, the adder 19, the phase difference accumulator 20 and the parameter output part 25 correspond to a phase comparator defined in the appended claims.

The loop filter 21 generates data to control the VCO 11 based on the accumulated value from the phase difference accumulator 20, and outputs the same as a control signal. The loop filter 21 is controlled based on the accumulated value in order to stabilize the output of the loop filter 21.

Based on input frequency setting information (information on the desired oscillatory frequency) and in order to obtain such a frequency as the output from the VCO 11, the parameter output part 25 calculates the frequency division value (NN), the inverse-rotational vector V' to the inverse rotational vector multiplier 17, the fine adjustment frequency to the adder 19, and the voltage value to the voltage output part 23 as frequency parameters, and outputs these parameters at calculated timings. The inverse-rotational vector V' is calculated based on the rotational vector V and the frequency setting information. The parameter output part 25 may store various parameters in a table or the like beforehand, and read the parameters therefrom.

The amplitude information detector 26 receives the output from the inverse-rotational vector multiplier 17 as an input, performs an operation of $I^2+Q^2$ where I and Q denote a real part and an imaginary part of the rotational vector, respectively, and outputs an AGC correction value determined from the operation result (amplitude information) to the filter 27. Based on the amplitude information, the correction value in the AGC circuit can be acquired.

The amplitude information detector 26 has a fixed controllable input amplitude range, and includes unlock detection means inside therein. The amplitude information detector 26 further has a threshold value (the value of amplitude information at which the PLL control does not operate properly) set therein. The unlock detection means determines whether or not the amplitude exceeds the threshold value, and when the amplitude exceeds the threshold value, the amplitude information detector 26 detects and outputs an unlock detection signal to perform unlock process to prevent lock.

Although unlock detection is performed based on the value of the amplitude information, unlock detection may be performed based on the AGC correction value acquired based on the amplitude information.

The filter 27 outputs, to the multiplier 28, a gain with a characteristic enabling adequate automatic gain control with respect to the amplitude information determined by the amplitude information detector 26.

The multiplier 28 multiplies the output from the AD converter 14 by the output (gain) from the filter 27, and outputs the same to the carrier remove 16. The multiplication of the gain by the multiplier 28 is adjusted so that the amplitude information can be kept constant.

[Characteristic Operation of the Second PLL Oscillator Circuit]

The following describes a feature of the second PLL oscillator circuit specifically.

In the second PLL oscillator circuit, although not illustrated, the unlock detection means in the amplitude information detector 26 monitors the value of the amplitude information, determines whether or not a value of the amplitude information falls within a specific range (a value in a preset range=a value in a range where PLL control does not operate properly), and detects an unlock state when the value of the amplitude information falls within the specific range.

Such unlock detection means may be provided in the amplitude information detector 26, may be provided independently in the FPGA, or may be provided in another control circuit in the FPGA.

Thusly, in the second PLL oscillator circuit, when the input level to the AD converter 14 changes, the unlock detection means determines, based on the value of the amplitude information acquired by the amplitude information detector 26, whether or not the input level to the A/D converter 14 falls within the range where PLL control does not operate properly, and detects an unlock state when the value falls within the range where the PLL control does not operate properly.

In the second PLL oscillator circuit, the unlock detection means monitors the maximum value or the minimum value of the value to be input to the filter 27 based on the value of the amplitude information acquired by the amplitude information detector 26, and detects an unlock state when the maximum value becomes a first specific value or more, the first specific value making the PLL control not operate properly or when the minimum value becomes a second specific value or less, the second specific value making the PLL control not operate properly.

That is, when the output signal level of the AD converter 14 falls within a preset range (a range making PLL control not operate properly), the second PLL oscillator circuit may detect it as an unlock state and detect alarm (output alarm sound or alarm display).

According to the second PLL oscillator circuit, when the input level to the AD converter 14 exceeds a normal operational range of PLL control, an unlock state is detected, thereby preventing occurrence of a frequency shift.

[Operation of MPU 4 in the Second PLL Oscillator Circuit]

In this second PLL oscillator circuit, the MPU 4 processes and operates similarly in the first PLL oscillator circuit.

More specifically, when receiving an unlock detection signal from the amplitude information detector 26, the MPU 4 typically outputs an unlock alarm output signal to the outside.

The MPU 4 further outputs, in accordance with configuration data externally input, a command for unlock alarm test to the maintenance interface part 30 in the lock state.

Then, in the second PLL oscillator circuit, the command for unlock alarm test allows parameters implementing an unlock state to be set at various parts by the parameter output part 25 so as to implement an unlock state, and the amplitude information detector 26 outputs an unlock detection signal indicating the unlock state.

Upon receipt of the unlock detection signal from the amplitude information detector 26, the MPU 4 outputs an unlock alarm output signal to the outside. If the unlock state continues for a specific time period (a first time period), the MPU 4 further sets data for relock at the maintenance interface part 30 for executing retry.

If the unlock state does not continue for the specific time duration (the first time period), the MPU 4 determines whether or not a lock state continues for a specific time period (a second time period). If the lock state continues for such a time period, the MPU 4 outputs an unlock alarm output signal as an alarm cancellation state. If the lock state does not continue for the second time period, the MPU 4 does not execute retry until the unlock state continues for the above-stated first time period.

Similarly to the first PLL oscillator circuit, the MPU 4 manages the number of retries, and when the circuit still remains in the unlock state in spite of retries a specific number of times, the MPU 4 stops retry and holds the unlock alarm output signal.

That is, the flowchart of FIG. 3 is applicable to the second PLL oscillator circuit as well.

Advantages of Embodiments

According to the first and the second PLL oscillator circuits, when the circuit is in the lock state, data for implementing an unlock state is set to examine the unlock state. When the circuit turns into the unlock state, an unlock alarm output signal is output to the outside, and if the unlock state continues for a first time period, retry for relock is executed, and if the unlock state does not continue for the first time period, retry is not executed until the unlock state continues for such a time period. Thereby, the first and the second PLL oscillator circuits are capable of executing retry for relock to return to the lock state when the lock state is shifted to the unlock state and the unlock state continues for a specific time period, and so have the advantage of saving time and trouble for relock.

The present invention is suitable for a PLL oscillator circuit that examines an unlock state, while automatically retrying relock.

What is claimed is:
1. A PLL oscillator circuit, comprising:
a voltage controlled oscillator that generates a frequency signal for oscillation in accordance with an input control voltage;
a PLL-IC that receives an external reference signal and an oscillatory output signal from the voltage controlled oscillator as input, compares phase between the external reference signal and the oscillatory output signal to detect a phase difference therebetween, and outputs a phase differential signal corresponding to the phase difference, while outputting a lock detection signal indicating a lock state where the signals are locked or an unlock state where the signals are not locked;
a loop filter that cancels noise of a high-frequency component in the phase differential signal from the PLL-IC; and
a processor that receives a lock detection signal from the PLL-IC, sets data for unlock alarm test at the PLL-IC, the data turning a lock state into an unlock state, when determining an unlock state with the lock detection signal from the PLL-IC, outputs an unlock alarm output signal to the outside, determines whether or not the unlock state continues for a first time period, and when the unlock state continues for the first time period, executes retry to set data for relock at the PLL-IC.

2. A PLL oscillator circuit, comprising:
a voltage controlled oscillator that generates a frequency signal for oscillation in accordance with an input control voltage;
a divider that divides the frequency signal;
an AD converter that analog-to-digital (AD) converts the divided signal;
a phase comparator that compares a phase of the AD-converted signal with a phase of a sinusoidal signal to detect a phase difference therebetween, and outputs a phase differential signal corresponding to the phase difference;
a loop filter that cancels noise of a high-frequency component in the phase differential signal;
a DA converter that digital-to-analog (DA) converts the phase differential signal with noise cancelled;
a parameter output part that outputs a frequency parameter to other parts; and
a processor that determines an unlock state and outputs an unlock alarm output signal,
wherein the phase comparator includes, as an automatic gain control circuit, a multiplier provided at a subsequent stage of the AD converter and an amplitude information detector that detects amplitude information for controlling a gain of the multiplier and outputs an unlock detection signal based on the amplitude information, and
the processor determines a lock state or an unlock state based on the unlock detection signal, sets a command for unlock alarm test at the parameter output part, the command turning a lock state into an unlock state, when determining an unlock state with the unlock detection signal, outputs an unlock alarm output signal to the outside, determines whether or not the unlock state continues for a first time period, and when the unlock state continues for the first time period, executes retry to set data for relock at the parameter output part.

3. The PLL oscillator circuit according to claim 2, wherein the phase comparator includes:
a carrier remove that quadrature-detects an output from the AD converter to acquire a rotational vector that rotates with a frequency difference between an output signal from the AD converter and a signal for detection;
an inverse-rotational vector multiplier that multiplies the rotational vector by an inverse-rotational vector;
a phase time difference detector that detects a phase difference for every sampling time based on the rotational vector reduced in speed by multiplication;
an adder that subtracts a fine adjustment frequency from the detected phase difference; and
a phase difference accumulator that accumulates an output from the adder for a given time period,
wherein the amplitude information detector monitors amplitude information detected from a signal that is branched off and input from an output from the inverse-rotational vector multiplier and outputs an unlock detection signal when the amplitude information falls within a specific range.

4. The PLL oscillator circuit according to claim 1, wherein when an unlock state does not continue for the first time period, the processor determines whether or not a lock state continues for a second time period, and when a lock state continues for the second time period, the processor turns the unlock alarm output signal into an alarm cancellation state and does not execute retry.

5. The PLL oscillator circuit according to claim 2, wherein when an unlock state does not continue for the first time period, the processor determines whether or not a lock state continues for a second time period, and when a lock state continues for the second time period, the processor turns the unlock alarm output signal into an alarm cancellation state and does not execute retry.

6. The PLL oscillator circuit according to claim 3, wherein when an unlock state does not continue for the first time period, the processor determines whether or not a lock state continues for a second time period, and when a lock state continues for the second time period, the processor turns the unlock alarm output signal into an alarm cancellation state and does not execute retry.

7. The PLL oscillator circuit according to claim 1, wherein when an unlock state does not continue for the first time period, the processor determines whether or not a lock state continues for a second time period, and when a lock state does not continue for the second time period, the processor does not execute retry until an unlock state continues for the first time period.

8. The PLL oscillator circuit according to claim 2, wherein when an unlock state does not continue for the first time period, the processor determines whether or not a lock state continues for a second time period, and when a lock state does not continue for the second time period, the processor does not execute retry until an unlock state continues for the first time period.

9. The PLL oscillator circuit according to claim 3, wherein when an unlock state does not continue for the first time period, the processor determines whether or not a lock state continues for a second time period, and when a lock state does not continue for the second time period, the processor does not execute retry until an unlock state continues for the first time period.

10. The PLL oscillator circuit according to claim 4, wherein the first time period is set longer than the second time period.

11. The PLL oscillator circuit according to claim 5, wherein the first time period is set longer than the second time period.

12. The PLL oscillator circuit according to claim 7, wherein the first time period is set longer than the second time period.

13. The PLL oscillator circuit according to claim 8, wherein the first time period is set longer than the second time period.

14. The PLL oscillator circuit according to claim 4, wherein the first time period is set shorter than the second time period.

15. The PLL oscillator circuit according to claim 5, wherein the first time period is set shorter than the second time period.

16. The PLL oscillator circuit according to claim 7, wherein the first time period is set shorter than the second time period.

17. The PLL oscillator circuit according to claim 8, wherein the first time period is set shorter than the second time period.

18. The PLL oscillator circuit according to claim 1, wherein the processor manages the number of retries, and when retry is executed a specific number of times, the processor stops retry and holds an unlock alarm output signal.

19. The PLL oscillator circuit according to claim 2, wherein the processor manages the number of retries, and when retry is executed a specific number of times, the processor stops retry and holds an unlock alarm output signal.

* * * * *